(12) United States Patent
Simmons et al.

(10) Patent No.: US 8,065,570 B1
(45) Date of Patent: Nov. 22, 2011

(54) TESTING AN INTEGRATED CIRCUIT HAVING CONFIGURABLE INPUT/OUTPUT TERMINALS

(75) Inventors: Tuyet Ngoc Simmons, Monte Sereno, CA (US); Madan Mohan Patra, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 488 days.

(21) Appl. No.: 12/011,744

(22) Filed: Jan. 28, 2008

(51) Int. Cl.
*G06K 5/04* (2006.01)
*G01R 31/28* (2006.01)

(52) U.S. Cl. .................. 714/712; 714/700; 714/725

(58) Field of Classification Search .............. 365/63, 365/51, 52; 714/725
See application file for complete search history.

(56) References Cited

U.S. PATENT DOCUMENTS

| | | | | |
|---|---|---|---|---|
| 5,933,025 A * | 8/1999 | Nance et al. | ................... | 326/81 |
| 6,028,450 A * | 2/2000 | Nance | ................... | 326/81 |
| 6,445,245 B1 * | 9/2002 | Schultz et al. | ................... | 327/541 |
| 6,724,880 B1 * | 4/2004 | Lynch | ................... | 379/219 |
| 6,963,218 B1 * | 11/2005 | Alexander et al. | ................... | 326/30 |
| 7,398,341 B1 * | 7/2008 | Gaither | ................... | 710/69 |
| 7,434,125 B2 * | 10/2008 | Frankowsky | ................... | 714/724 |
| 7,653,505 B1 * | 1/2010 | Simmons et al. | ................... | 702/118 |
| 2002/0101278 A1 * | 8/2002 | Schultz et al. | ................... | 327/543 |
| 2004/0008054 A1 * | 1/2004 | Lesea et al. | ................... | 326/30 |
| 2004/0030976 A1 * | 2/2004 | Ghameshlu et al. | ................... | 714/732 |
| 2007/0290704 A1 * | 12/2007 | Shyh et al. | ................... | 324/763 |

* cited by examiner

*Primary Examiner* — Kevin L Ellis
*Assistant Examiner* — Daniel McMahon
(74) *Attorney, Agent, or Firm* — Kevin T. Cuenot

(57) ABSTRACT

Testing an integrated circuit (IC) having numerous terminals coupled to numerous digitally controlled impedance (DCI) modules, where the numerous DCI modules control configurable impedances of the numerous terminals. The IC further includes a control circuit having outputs coupled to enable inputs of the numerous DCI modules, where operating the IC in a test mode configures the control circuit to selectively couple a control signal to the enable terminals of the numerous DCI modules. One DCI module of the numerous DCI modules can be enabled at a time facilitating testing of the configurable impedances of the I/O terminals.

20 Claims, 6 Drawing Sheets

TESTING AN INTEGRATED CIRCUIT HAVING CONFIGURABLE INPUT/OUTPUT TERMINALS

FIELD OF THE INVENTION

The invention relates to integrated circuit (IC) devices. More particularly, the invention is related to testing of an IC.

BACKGROUND

Integrated circuit (IC) manufacturers rigorously test their ICs to guarantee functionality, performance, and compliance with data sheet specifications and various industry standards. In many instances, IC manufacturers employ automated test equipment (ATE) to perform the various tests. An ATE's test capabilities are generally limited by operating frequency, number of input/output (I/O) channels/terminals available, and various modules used for testing features of an IC. As technology evolves, higher performing ICs are being manufactured, for example, faster and functionally more complex ICs including hundreds of I/O terminals which often exceed the ATE capabilities. In such instances, the IC manufacturer may be forced to upgrade to a more expensive ATE, or relying on a sub-optimal testing environment.

In an example, a programmable logic device (PLD) is well-known type of an IC that can be programmed to perform a specified logic function. The PLD can be configured to perform a logic function based on configuration data uploaded during the configuration cycle of the PLD. One type of PLD is a field programmable gate array (FPGA). Advancements in FPGA development the past few years have made them very valuable devices for system development in highly integrated systems. An advanced FPGA device typically has a high operating frequency and hundreds of I/O terminals that may be coupled to a printed circuit board (PCB) as a part of a system. Testing these advanced FPGA's including hundreds of I/O terminals has been a very challenging task due in part to the ATE limitation in terms of the number of I/O channels available.

Therefore, a need exists for a method and apparatus for testing an IC including numerous I/O terminals that complements ATE capabilities, and provides information regarding performance and pass/fail criteria of the IC device.

SUMMARY OF THE INVENTION

The different embodiments of the invention provide a method of testing an integrated circuit (IC) having a plurality of I/O terminals and a plurality of digitally controlled impedance (DCI) modules, where the plurality of DCI modules configure impedances of the plurality of I/O terminals, and where each DCI module of the plurality of DCI modules configure impedances of a portion of I/O terminals of the plurality of I/O terminals based on a reference source. The IC include a plurality of select circuits having outputs coupled to enable terminals of the plurality of DCI modules. Operating the IC in a test mode configures the plurality of select circuits to selectively couple control signals to the enable terminals of the plurality of DCI modules, and where data of the control signals enable only one DCI module of the plurality of the DCI modules at a time In another embodiment of the present invention, a method of testing termination impedances of a plurality of I/O terminals of an IC having a plurality of DCI modules coupled with impedances of the plurality of I/O terminals is described. The method include coupling a control module to the plurality of DCI modules, operating the control module in a test mode, applying a data pattern to an input of the control module, and testing the impedances of the plurality of configurable I/O terminals. Each DCI module of the plurality of DCI modules configures impedances of a portion of the plurality of I/O terminals, and where the applied data pattern enables only one DCI module of the plurality of DCI modules at a time.

BRIEF DESCRIPTION OF THE DRAWINGS

One or more aspects of the present invention is illustrated by way of example, and not by way of limitation, in the following figures. The accompanying drawing(s) should not be taken to limit the invention to the embodiment(s) shown, but are for explanation and understanding only.

DETAILED DESCRIPTION OF THE DRAWINGS

While the specification concludes with claims defining some features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and/or functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention. In other instances, well-known circuits and devices may be omitted or presented in an abstract form in order to avoid obscuring the present invention.

Figure 1A:
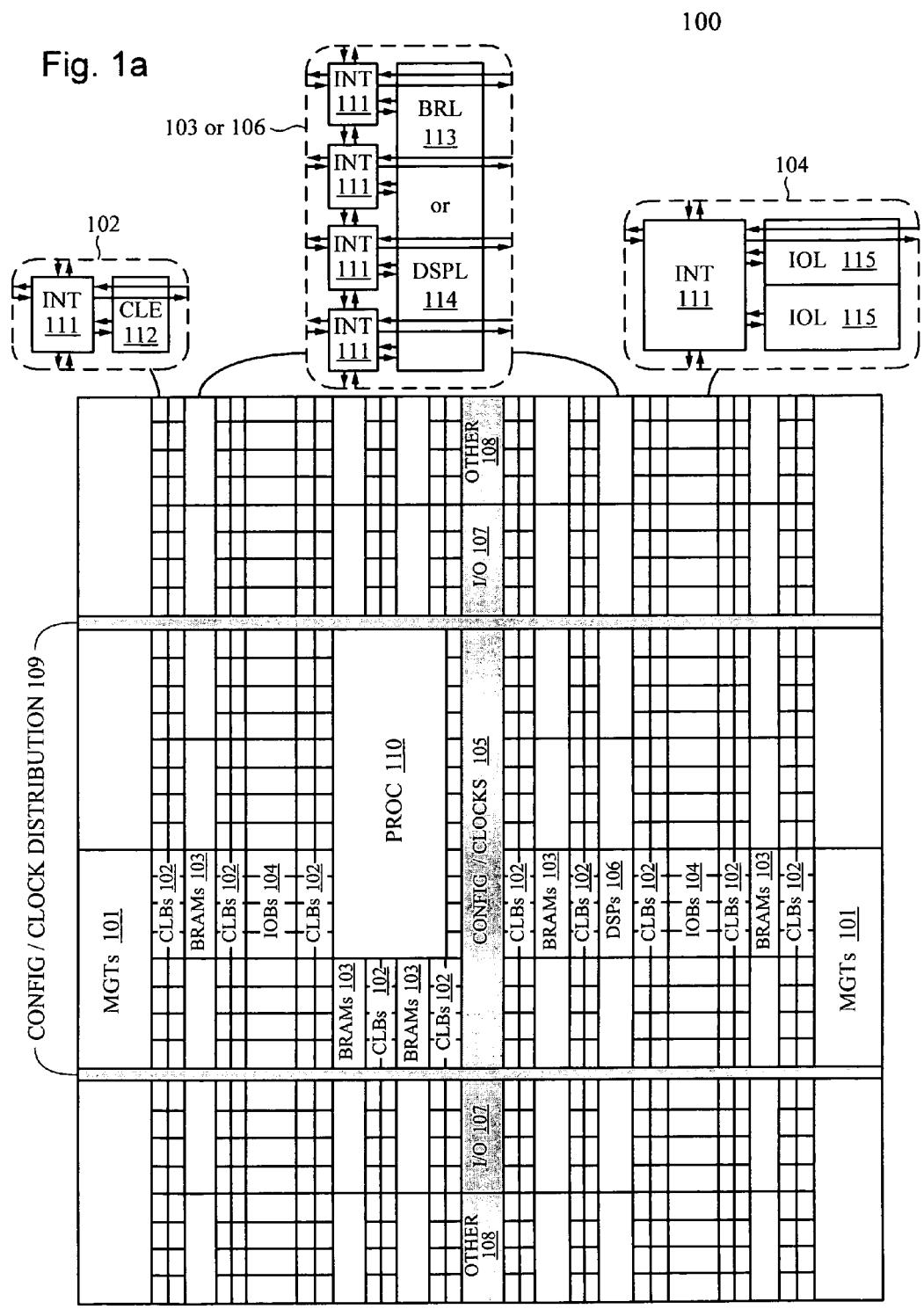
FIG. 1a illustrates exemplary field programmable gate array (FPGA) device architecture.

As mentioned above, an FPGA is a well known type of an IC. In general, FPGAs may include several different types of programmable logic blocks in the array. For example, FIG. 1a illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1a.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). For instance, IOLs 115 may be configured to have termination impedance, where the termination impedance may be necessary to maintain signal integrity. In other instances termination impedance may be needed to conform to a signaling standard, such as Low-voltage differential signaling (LVDS) which is well know to persons skilled in the art. Also, it will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1a) is used for configuration, clock, and other control logic. Horizontal areas 109 extending from this column are used to distribute the clocks and configuration signals across the breadth of the FPGA.

Some FPGAs utilizing the architecture illustrated in FIG. 1a include additional logic blocks that disrupt the regular columnar structure making up a large part of the FPGA. The additional logic blocks can be programmable blocks and/or dedicated logic. For example, the processor block PROC 110 shown in FIG. 1a spans several columns of CLBs and BRAMs.

Note that FIG. 1a is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1a are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 1B:
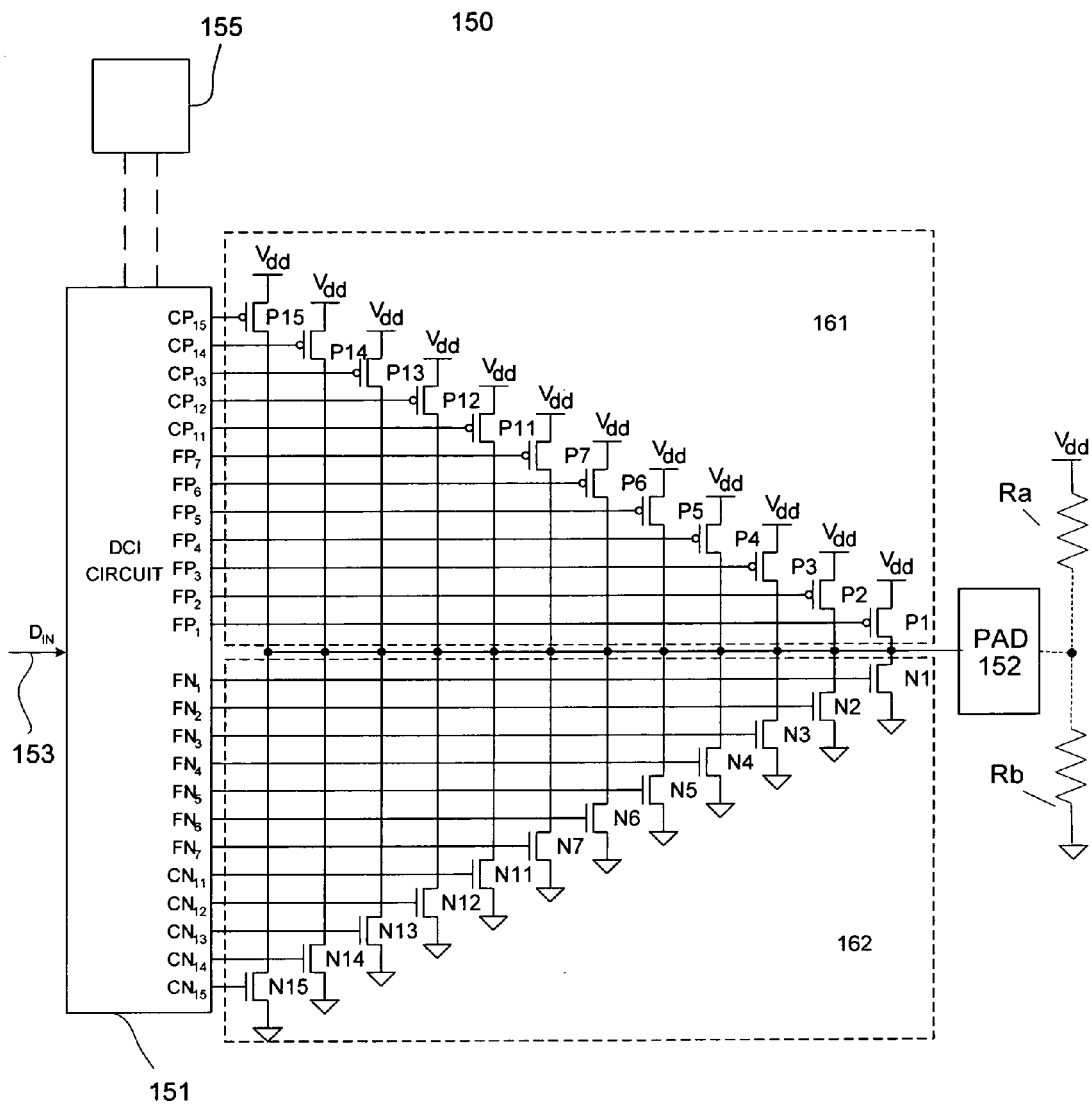
FIG. 1b illustrates an example of an output driver including a DCI circuit of a configurable I/O terminal of an integrated circuit.

FIG. 1b is a circuit diagram of an output driver 150, where circuit 150 may be a part of an I/O terminal of an integrated circuit. Output driver 150 may include digitally controlled impedance (DCI) circuit/module 151, p-channel pull-up transistors P1-P7 and P11-P15, n-channel pull-down transistors N1-N7 and N11-N15, and I/O pad 152. P-channel pull-up transistors P1-P7 and P11-P15 are collectively referred to as p-channel transistors 161, and n-channel pull-down transistors N1-N7 and N11-N15 are collectively referred to as n-channel transistors 162. In other embodiments, other combinations of transistors can be used.

As described in more detail below, p-channel transistors P1-P7 may be used as "fine-adjustment" transistors, each having an on-conductance of "Yp" siemens. Similarly, n-channel transistors N1-N7 may be used as "fine-adjustment" transistors, each having an on-conductance of "$Y_N$" siemens. P-channel transistors P11-P15 may be used as "coarse-adjustment" transistors, having on-conductances of $1X_P$, $2X_P$, $4X_P$, $8X_P$ and $16X_P$ siemens, respectively. N-channel transistors N11-N15 may also be used as "coarse-adjustment" transistors, having on-conductances of $1X_N$, $2X_N$, $4X_N$, $8X_N$ and $16X_N$ siemens, respectively. In the described example, Yp is approximately equal to $X_P$, and $Y_N$ is approximately equal to $X_N/2$. In other embodiments, other conductance values can be used.

Each of fine p-channel transistors P1-P7 and coarse p-channel transistors P11-P15 has a source coupled to a $V_{dd}$ voltage supply terminal. Each of fine n-channel transistors N1-N7 and coarse n-channel transistors N11-N15 has a source coupled to a ground voltage supply terminal. The drains of transistors P1-P7, P11-P15, N1-N7 and N11-N15 are coupled to I/O pad 152.

The gates of fine p-channel transistors P1-P7 are coupled to receive control signals $FP_1$-$FP_7$, respectively, from DCI circuit 151. Similarly, the gates of coarse p-channel transistors P11-P15 are coupled to receive control signals $CP_{11}$-$CP_{15}$, respectively, from DCI circuit 601. The gates of fine n-channel transistors N1-N7 are coupled to receive control signals $FN_1$-$FN_7$, respectively, from DCI circuit 151. Similarly, the gates of coarse n-channel transistors N11-N15 are coupled to receive control signals $CN_{11}$-$CN_{15}$, respectively, from DCI circuit 151.

DCI circuit 151 is configured to receive a data input signal $D_{IN}$ (e.g., signal 153) having a logic high or logic low value. In general, when the $D_{IN}$ signal has a logic low value, DCI circuit 151 asserts one or more of the control signals $FP_1$-$FP_7$, $CP_{11}$-$CP_{15}$ to a logic low value, thereby turning on one or more of p-channel transistors P1-P7, P11-P15. The turned on p-channel transistors are selected in a manner described in more detail below. DCI circuit 151 also provides logic low control signals $FN_1$-$FN_7$, $CN_{11}$-$CN_{15}$, thereby turning off all of n-channel transistors N1-N7 and N11-N15. As a result, pad 152 is coupled to the $V_{dd}$ voltage supply terminal through the turned-on p-channel transistors. DCI circuit 151 may select the turned-on p-channel transistors to provide a particular resistance (e.g., series termination) between the $V_{dd}$ voltage supply terminal and pad 152.

In general, if output driver circuit 150 is used to provide a transmission line termination (as described in more detail below), then output driver circuit 150 will be configured to turn on a combination of n-channel and/or p-channel transistors to provide the appropriate transmission line termination resistance.

In the examples described below, coarse p-channel transistors P11-P15 are enabled in a binary count order to provide a coarse resistance adjustment. Fine p-channel transistors P1-P7 are then enabled or disabled to provide a fine resistance adjustment. For example, fine p-channel transistors P1-P3 and coarse p-channel transistor P13 may be turned on when the $D_{IN}$ signal has a low value. In this example, the equivalent conductance of the p-channel portion of output driver circuit 150 would be equal to $X_P+X_P+X_P+4X_P$, or $7X_P$ siemens.

If the $D_{IN}$ signal has a logic high value, then DCI circuit 151 asserts one or more of the control signals $FN_1$-$FN_7$, $CN_{11}$-$CN_{15}$ to a logic high value, thereby turning on one or more of n-channel transistors N1-N7, N11-N15. The turned on n-channel transistors are selected in a manner described in more detail below. DCI circuit 151 also provides logic high control signals $FP_1$-$FP_7$, $CP_{11}$-$CP_{15}$, thereby turning off all of p-channel transistors P1-P7 and P11-P15. As a result, pad 152 is coupled to the ground terminal through the turned-on n-channel transistors. DCI circuit 151 selects the turned-on n-channel transistors to provide a particular resistance between the ground terminal and pad 152.

In the examples described below, the coarse n-channel transistors N11-N15 are turned on in a binary count order to provide a coarse resistance adjustment. Fine n-channel transistors N1-N7 are then enabled or disabled to provide a fine resistance adjustment. For example, fine n-channel transistors N1-N2 and coarse n-channel transistors N11 and N14 may be turned on when the $D_{IN}$ signal has a high value. In this example, the equivalent conductance of the n-channel portion of output driver circuit 150 would be equal to $X_N/2+X_N/2+X_N+8X_N$, or $10X_N$ siemens.

An IC may include a plurality of output driver circuits that may be identical to output driver circuit 150. In general, one output driver circuit is selected to be a p-channel reference circuit, which is used to determine which p-channel transistors must be turned on to provide a desired resistance for a logic high output value or a desired transmission line termination. Similarly, one output driver circuit is selected to be an n-channel reference circuit, which is used to determine which n-channel transistors must be turned on to provide a desired resistance for a logic low output value or a desired transmission line termination. The determinations made by the p-channel and n-channel reference circuits are then transmitted to, and used by, other active output driver circuits. Other examples of implementing a DCI circuit is possible and well known to persons skilled in the art. For example, the DCI circuit 151 may be coupled to an external source 155. The external source 155 may be a reference resistor or a current source simulating a reference. The external source 155 may provide a reference to the DCI circuit 151, thereby circuit 151 may provide digital controls turning on/off p-channel/n-channel transistors to better match line impedance, or termination resistors (e.g., Ra and Rb) coupled to the pad 152.

Figure 2:
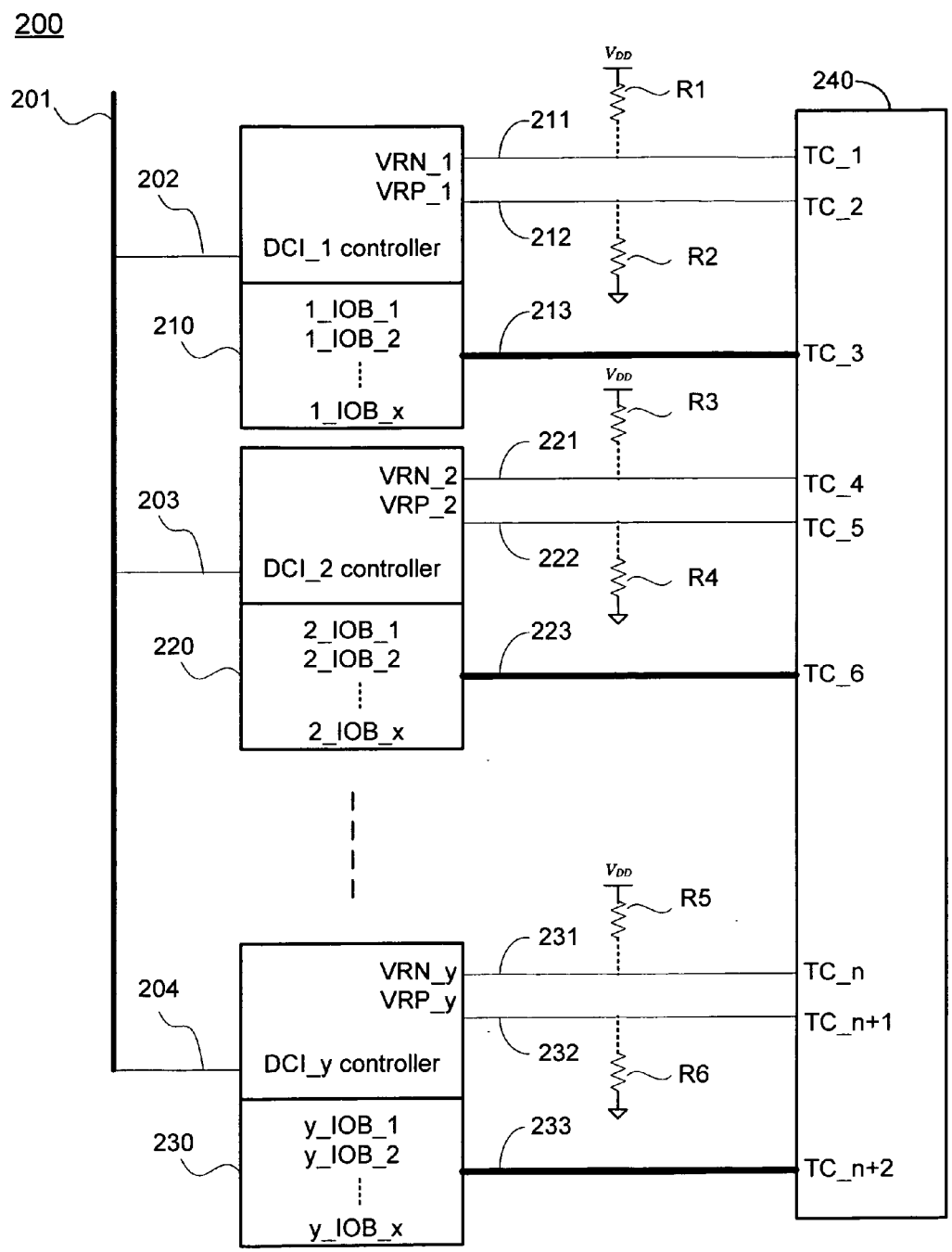
FIG. 2 illustrates an example of numerous I/O modules of an IC coupled to a test system.

In an example, an IC such as the FPGA 100 may include circuit 200 of FIG. 2. Circuits 210, 220, and 230 may be configurable I/O modules or circuits having I/O terminals capable of providing termination impedances, for example, I/O terminals coupled signals 213, 223, and 233 each having series termination impedances. The series terminations (or series termination impedances) of the I/O terminals may be configurable or programmable series termination for providing optimum signal integrity performance. For instance, In a test mode, series termination of I/O terminals coupled to signals 213, 223, and 233 may be tested or verified for proper operation. In general, an FPGA may include hundreds of I/O pins, which may be grouped in banks or clusters that may be referred to as I/O banks. In an example, I/Os of an FPGA may be grouped according to speed or the capability of meeting a specific I/O requirement such as low-voltage differential signaling (LVDS) or current mode logic (CML). In some instances, I/O terminals of an IC may include configurable impedance terminations. In general, terminating an I/O is well known to persons skilled in the art.

In general, there are two different ways to terminate an I/O terminal: Parallel termination at the far end of a driver and series termination at the driver end. For instance, series termination may be the preferred method for single-source single-destination transmission lines, where one discrete resistor per pin (or I/O terminal) is required. In an example, I/O circuits of the FPGA 100 including series terminations may solve this problem by eliminating the need for the external resistors. The FPGA 100 may include the use of digitally controlled impedance (DCI) to configure termination impedance of an I/O bank, such as I/O terminals of circuits 210, 220, and 230 of FIG. 2. A user may configure impedance value of the I/O terminals or banks to have a series termination within a wide programmable range (e.g., 20-100 Ohms). The series termination of an I/O bank may be determined by an external reference, such as resistors, coupled to a reference terminal of each DCI module (e.g., VRN_1 and VRP_1 of circuit 210). For instance, circuit 200 illustrates a plurality of DCI modules including two reference terminals VRN and VRP, where VRN may be coupled to a pull-up resistor, while VRP may be coupled to a pull-down resistor. The reference terminals (e.g., VRN, and VRP) may be used to provide a differential reference for a more accurate calibration of termination impedances of I/Os of the IC.

For example, when an I/O bank is configured to have series termination impedance, such as I/O terminals of circuit 210, a DCI controller circuit of each I/O bank (e.g., DCI_1 of circuit 210) may provide a control signal to configure the series termination impedance. The control signal of each DCI circuit may configure the corresponding I/O bank based on an external reference, such as resistors R1-R2 of circuit 210. In an example, circuit 210 of FIG. 2 may include reference resistor R1 having one terminal coupled to VRN_1 and the other terminal coupled to $V_{DD}$. While a second reference resistor R2 has one terminal coupled to VRP_1 and the other terminal coupled to a ground potential. The DCI circuit or module of circuit 210 (i.e., DCI_1 controller) when enabled may provide control signals to the I/O terminals of circuit 210. The I/O terminals of circuit 210 may include configurable impedances provide series termination, where the I/O terminals may be coupled to signal 213. For example, signal 213 may be coupled to twenty I/O terminals of circuit 210 providing series terminations. In some instances, the twenty I/O terminals of circuit 210 may provide terminations to twenty single ended signals or ten differential signal.

The I/O terminals coupled to signal 213 may provide series termination impedances based on the reference resistors R1 and R2. For instance, if R1 and R2 have a value of 50 Ohms, then signal 213 may provide I/O terminals each having a series resistance of approximately 50 Ohms. The value of the series termination impedances of the I/O terminals also referred to as series termination may be maintained over parameters, such as power supply and temperature variations. For example, the value of the series termination may be maintained over a supply voltage range of Vdd +/−10%, and a temperature range of 0 deg C.-100 deg C. The stability the value of series termination may be partially due the use of external reference (e.g., resistor) and the DCI module providing control signal to maintain the value of series termination based on the external reference.

FIG. 2 illustrates configurable I/O banks including DCI controllers or modules. Other configurations and implementations of the DCI controllers in an IC are possible. For example, the DCI controllers of FIG. 2 may be included as parts of an IC but not necessarily as a part of the configurable I/O banks. Circuit 200 may receive control signals 202-204 provided by signal 201, where the control signals 202-204 are respectively coupled to enable terminals of circuits 210, 220, and 230. For instance, in a normal operation (non-test) mode one or more of the control signals 202-204 may be asserted. The asserted control signals (e.g., signals 202-204) may enable one or more DCI controllers corresponding to the asserted control signal(s). For example, the FPGA 100 may include several I/O banks having configurable I/O terminals capable of providing serial terminations. In general, an IC including I/O terminals having configurable series terminations is well known to persons skilled in the art, and testing such I/Os is challenging and resource intensive.

The pictured embodiment of FIG. 2 shows tester channels of a test equipment 240 coupled to I/O bank 210, 220, and 230. A portion the tester channels may provide signals to the I/Os that may be used as a reference source. FIG. 2 shows signals 211, 212, 221, 222, 231, and 232 respectively coupled to tester channels TC_1, TC_2, TC_4, TC_5, TC_n and TC_n+1 of test system 240. In general, when testing an IC having hundreds of I/O pins, the proper utilization of tester channels is crucial since I/O terminals of the IC may exceed the number of tester channels available. A test engineer may utilize available tester channels for vital functional and/or performance testing of the IC. In another example, using external resistors for providing the necessary references, such as resistors R1-R6, may reduce the number of tester channels required, but the external resistors may occupy valuable PCB resources such as board space and interconnect resources. Also, there is the issue of reliability since resistors placed on a PCB may not be verified to operate properly. In general, the PCB and components of the PCB (e.g., resistors) are not a part of the ATE system calibration and validation. Therefore, the proper verification of components of the PCB, such as resistors R1-R6, may not be performed automatically.

FIG. 2 shows numerous I/O banks 210, 220, and 230 each including DCI controller DCI_1, DC_2, and DCI_y. Each DCI controller may include inputs coupled to receive a reference source. The reference source may be external resistors such as R1-R6 or a current source simulating a reference impedance. For instance, the test system 240 may provide the current source via tester channels. The current source provided by the test equipment/system may sink or source current simulating a reference impedance. In general, a DCI controller has internal circuits that can use a resistor or a current source as a reference. The DCI controller may provide control signals to configurable/programmable termination impedances of I/O based on the reference source. An IC having numerous DCI controllers may require numerous reference sources, therefore, numerous tester channels for providing the reference sources. Other issues related to the testing of ICs including external components discussed above are well known to persons skilled in the art. Therefore, it is desirable to use tester channels of an ATE system for providing the appropriate reference source to the IC under test.

Figure 3:
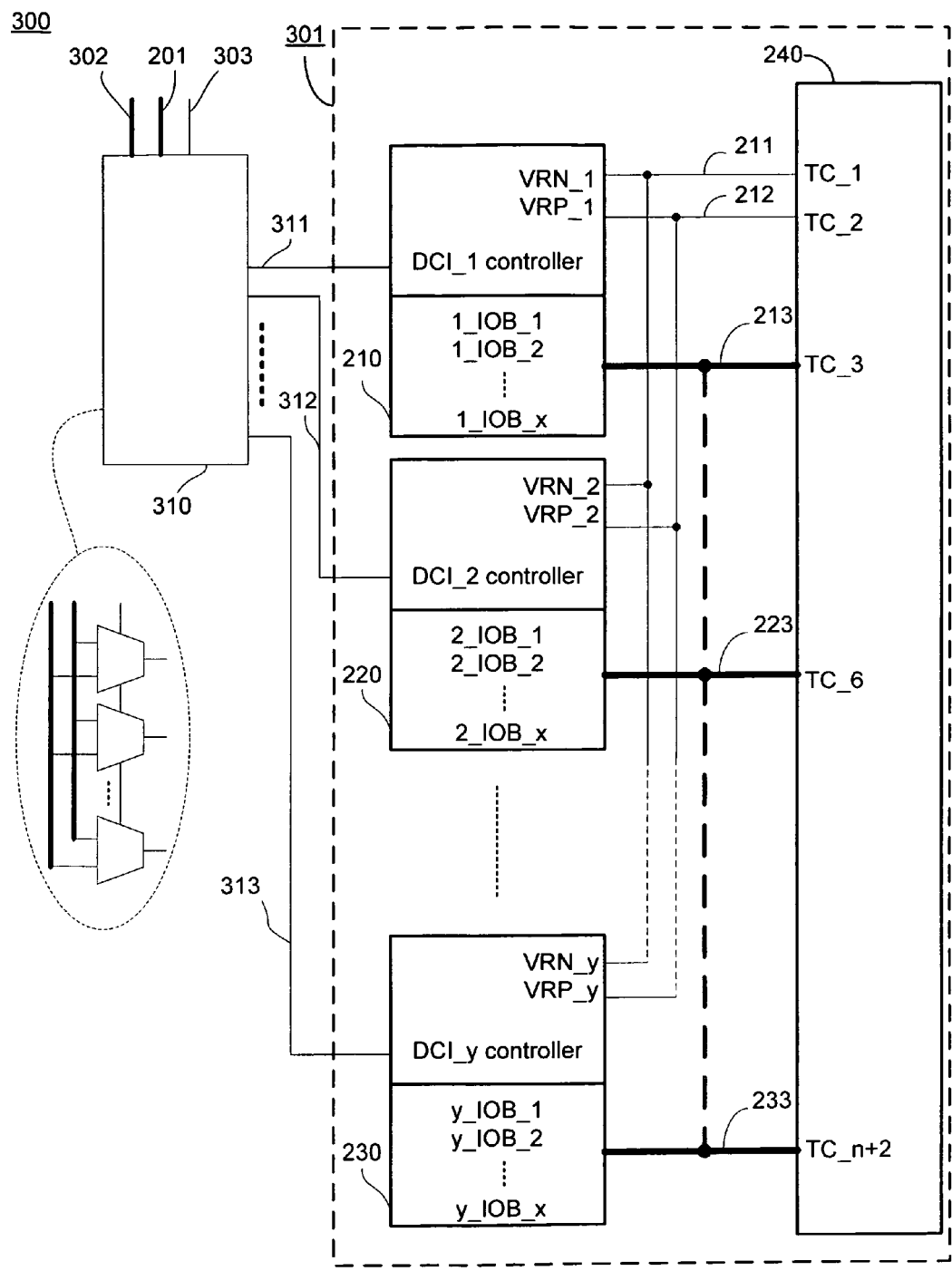
FIG. 3 illustrates numerous I/O modules of an IC coupled to a test system according to an embodiment of the present invention.

FIG. 3 illustrates a circuit having numerous configurable I/O banks of an IC coupled to a test system according to an embodiment of the present invention. In general, testing an IC may require a automated test equipment (ATE), a test code, and a PCB coupled with the IC under test. The PCB also facilitate an electrical link between the IC under test and the test system. The test code mentioned above may be a software code developed for a particular test equipment and utilized to interface and stimulate the IC under test. Circuit 300 may include the configurable I/O banks of FIG. 2 (e.g., 210, 220, and 230), circuit 310, and the test system 240, where the test system 240 may be utilized to test termination impedances of I/O terminals of the configurable I/O banks. In an example, circuit 310 may be a control circuit providing control signals 311-313 coupled respectively to enable terminals of the configurable I/O banks 210, 220, and 230. In an example, the control signals 311-313 of circuit 310 may enable and disable the DCI controllers of the configurable I/O circuits 210, 220, and 230.

The control circuit 310 may be coupled to receive signal 201, signal 302, and test_en or test_mode signal 303. Signal 201 and signal 302 are selectively coupled to signals 311-313 (outputs of circuit 310) based on the test_en signal 303. In an example, an IC such as FPGA 100 may provide signal 201, where signal 201 is a part of the configuration or design. Signal 201 may provide predetermined values based on a specific design implementation of the FPGA or signal 201 may be provided by a memory. Signal 302 may be an externally controllable signal (e.g., provided by an external pin), where signal 302 may provide logic values independent of the design implementation and the FPGA configuration. In another example of the present invention, the FPGA may be configured to provide the signal 302, where signal 302 may provide logic values or pattern based on a design utilized during the test mode. Signal 303 is a control signal or a test mode signal that may be used to configure circuit 310 to operate in the test mode. For example, asserting signal 303 may configure circuit 310 to be in a test mode, where signal 302 is selectively coupled to signals 311-313. For instance, in the test mode the DCI controllers of I/O circuits 210, 220, and 230 may be controlled via external signals, where only one DCI controller is enabled at a given time.

In the test mode, logic values coupled to the signal 302 may dynamically enable and disable the DCI controllers of I/O circuits 210, 220, and 230 of FIG. 3. Circuit 300 also illustrates coupling reference terminals of the I/O banks via signals 211 and 212 to tester channels TC_1 and TC_2 of the test system 240. Tester channels TC_1 and TC2 may provide a reference source (e.g., current source providing a predetermined value) coupled to the I/O banks 210, 220, and 230. In an example, VRP_1, VRP_2, and VRP_y may be coupled together and to TC_2. Also, VRN_1, VRN_2, and VRN_y may be coupled together and to TC_1. The coupling of the reference inputs of the configurable I/O circuits 210, 220, and 230 as described above and as shown in FIG. 3 may be possible where only one configurable I/O bank is enabled. For example, in the test mode control circuit 310 may assert only one control signal of the control signals 311-313, which in turn may enable an I/O bank of the I/O banks 210, 220, and 230. In another example, signals 213, 223, and 233 of the configurable I/O banks 210, 220, and 230 may also be coupled to one another and to the channels of the test system 240 when the signal 303 is asserted (i.e., test mode). Coupling signals 213, 223, and 233 as described above may reduce the test system requirements regarding the number of test channels needed for testing, therefore, reducing test cost by using a test equipment with fewer resources.

Employing circuit 310 illustrated in FIG. 3 may enable the testing of an IC device (e.g., the FPGA of FIG. 1a) requiring fewer test channels of the test equipment 240, therefore, reducing test cost by using an ATE with fewer channel resources. Additionally, dynamically controlling circuits 210, 220, and 230 via signal 302 in the test mode may improve/reduce test time. Test time reduction may be possible since reconfiguration of the IC or FPGA under test may not be necessary to enable and disable the DCI controllers.

Circuit 310 of FIG. 3 is shown as a design block receiving signal 302, where signal 302 may be coupled to and controlled by tester channel of the test system 240. In another example, signal 302 may be a control signal providing dynamic serial data pattern (e.g., signal 401 of FIG. 4). Signal 401 may be coupled to and controlled by a tester channel of a test system or it may be generated by a circuit of the FPGA. Circuit 400 may be a control circuit configured to provide control signals 311-313. For example, the circuit 400 may be coupled to receive a test_en signal 303, signal 201, and signal 401. Circuit 400 may include D flip flops (D_FFs) 410-412, and select circuits or multiplexer circuits 420-422. In an example, the D_FFs 410-412 may be coupled together forming a shift register circuit or module. Signal 201 or the outputs of the D_FFs may be selectively coupled to signals 311-313 of circuit 400 based on the test_en signal 303.

In the test mode (i.e., test mode signal 303 is asserted), the outputs of D_FFs 410-412 are selectively coupled to signals 311-313. Outputs of the D_FFs 410-412 may have values based on serial data pattern provided by signal 401. In some instances, signal 401 may be a test pattern signal providing data to register 410. Values coupled to signal 401 may be provided externally or internally as will be described below. For instance, circuit 400 may include feedback register 413 that may provide a way for controlling signals 311-313 of FIG. 4 without the need of external stimulus. In such instances, no additional tester channels are needed to test the I/O banks.

Figure 4:
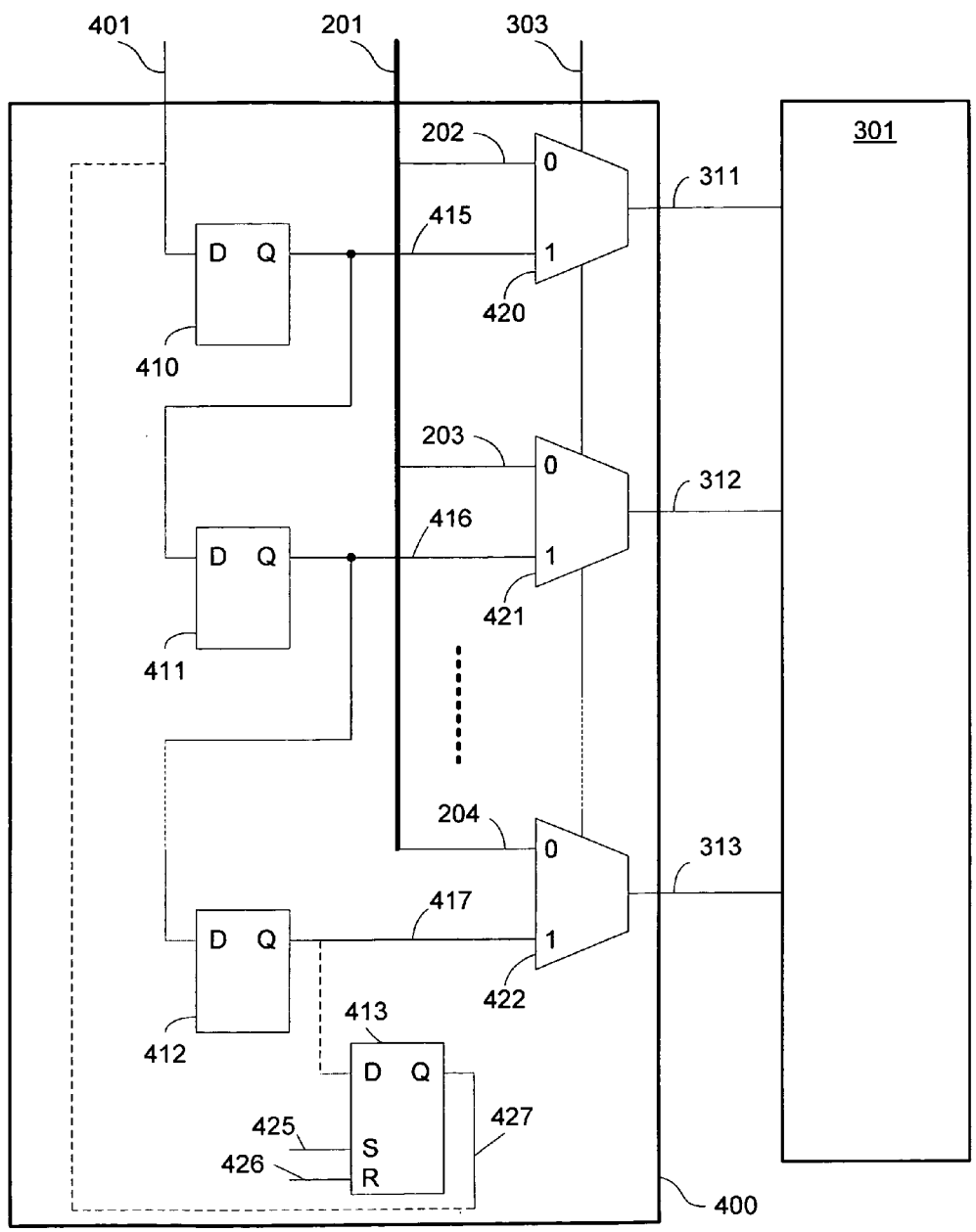
FIG. 4 illustrates a control circuit for providing control signals according to an embodiment of the present invention.

FIG. 4 also illustrates a feedback register 413 coupled to receive signal 417 (output of register 412), and signals 425 and 426. Signals 425 and 426 may be set and reset signals respectively asserted to initialize the feedback register 413. The feedback register may provide an output signal 427 initialized to a set state (e.g., logic high) or a reset state (e.g., logic low) based on the assertion of signals 425 or 426 respectively. Also, the feedback register 413 may be initialized based on a test mode. The circuit for initializing the feedback register 413 is not shown for simplicity. In a non test mode (i.e., signal 303 is de-asserted), signals 311-313 may be coupled to signals 202-204 (of signal 201). As mentioned above, signals 202-204 may have predetermined values based on a design implemented in the FPGA. Implementing the feedback register 413 may further reduce test cost and test time. Cost reduction may be attributed to utilizing a test equipment with fewer resources such as test channels, while test time reduction may be attributed to performing the testing of the FPGA without the need to setup the test equipment to provide the control signal(s).

In another example, circuit 400 may be a part of a scan chain circuit that can be used to test an IC. In general, the implementation of a scan chain circuit is well known to persons skilled in the art. Implementing circuit 400 may save valuable resources in terms of test time, test software (e.g., program development), and tester system resources (e.g., number of tester channels requirements). For instance, testing an FPGA including circuit 400, in an example, signal 401 may be coupled to a terminal of the FPGA. Also, an ATE tester channel may provide data pattern coupled to signal 401. For example, the data pattern of the tester channel may provide dynamic logic values asserting and de-asserting signals 311-313 while the FPGA in the test mode. In the example mentioned above, only one tester channel terminal is needed to control the numerous DCI controllers of the configurable I/O banks of the FPGA. Also, reconfiguration of the FPGA may not be necessary to test each configurable I/O bank including a DCI controller.

FIG. 3 and FIG. 4 illustrates various examples for implanting control circuits in an IC, where the control circuits may enable full functional testing of termination impedance of configurable I/O banks while requiring only a few tester channels to do so. Other benefits of implementing the control circuits described above may include reducing test time, and test program development. For example, FIG. 3 shows numerous configurable I/O circuits 210, 220, and 230, where each configurable I/O circuit may require numerous dedicated tester channels. Operating the IC (e.g., FPGA 100) in the test mode may configure the control circuit and the configurable I/O circuits for testing. The reference terminals of the configurable I/O circuits may be coupled together (e.g., shorted) conserving test system tester channels. In other instances, the I/O terminals (e.g., signals 213, 223, and 233) may also be coupled together (e.g., shorted) and to tester channels in the test mode, therefore, conserving additional tester channels. Another example illustrated in FIG. 4, where circuit 400 may be a scan chain circuit capable of providing the control signals (e.g., 311-313). Using a scan chain circuit (e.g., circuit 400) may reduce design resources needed, such as the need to develop additional circuits to provide the control signals 311-313. A portion or all of the circuit described above may be used to reduce the number of tester channels required for testing. Also, the control circuit may be implemented using, for example, a finite state machine (FSM) circuit. Other implementations of the control circuit are possible and well known to skilled people in the art.

Figure 5:
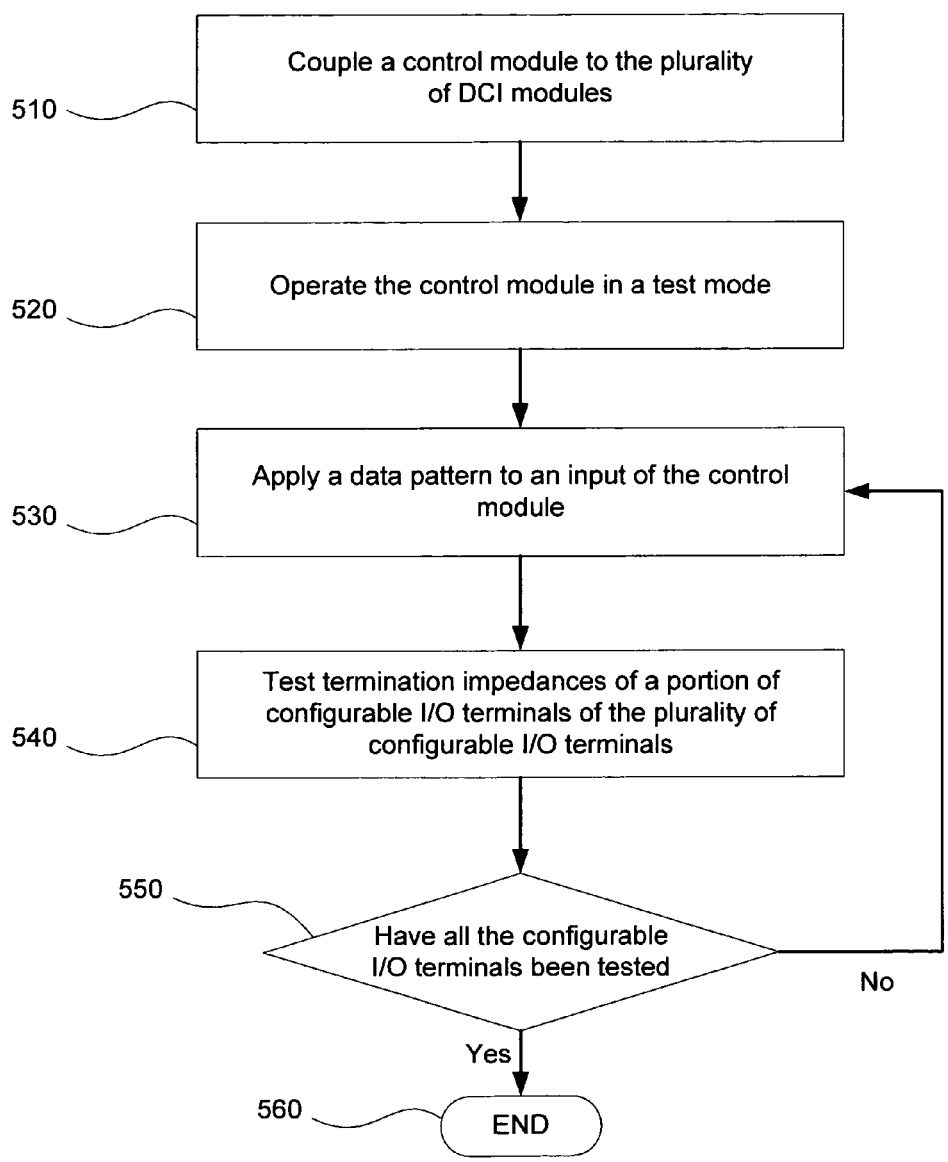
FIG. 5 illustrates a flow diagram for testing an IC including numerous I/O modules according to an embodiment of the present invention.

FIG. 5 describes a method of testing an IC having numerous configurable I/O modules including I/O terminals having programmable series termination impedances. The IC may also include numerous DCI modules, where the DCI modules adjust values of the programmable series termination impedances of the I/O terminals based on reference impedance. In general, the method described below may be implemented to test an IC, such as an FPGA. An FPGA may include hundreds of I/O terminals arranged in groups or banks according to parameters, such as speed and/or meeting a specific I/O standard such as LVDS. Many I/O terminals may include series termination impedance that may be grouped in various I/O banks. Testing the various I/O banks which may include these I/O terminals, require a test system that can handle the hundreds of I/O terminals. In such case, the method described below may reduce the number of I/O channel required in a test system.

The test method starts by coupling a control module to the numerous DCI modules (step 510), and operating the control module in a test mode (step 520). In an example, the control module may be coupled to receive a control signal, where asserting the control signal may operate the control module in the test mode. At step 530, a data pattern may be applied to an input of the control module. For instance, the data pattern may be serial data applied to an input terminal of an IC, where the input terminal of the IC is coupled with the input of the control module. The serial data pattern may enable the control module to provide control signals having values corresponding to the data pattern. Also, the control signal of the control module may be coupled to enable terminals of the numerous DCI modules of the IC, where only one DCI module of the numerous DCI modules may be enabled at a time while operating the control module in the test mode. The DCI modules may program the series termination impedances to have values corresponding to reference impedance. In another example, each DCI module may be coupled to receive a different reference impedance. At step 540, testing the series termination impedances of the I/O terminals, where the I/O terminals under test correspond to a configurable I/O module coupled to an enabled DCI module. As mentioned above, only one DCI module of the DCI modules may be enabled at a time while the IC is under test. The enabling of the DCI module is dependant on the applied data pattern of step 530. At step 540, functional testing of the termination impedances may be performed.

For instance, successful functional testing may qualify the configurable I/O modules and supporting circuits as having proper operation meeting test parameters, such as impedance value. A decision can be made at step 550 if all the configurable I/O modules have been tested, then the testing of the configurable I/O modules may end (step 560). If one or more configurable I/O module remain to be tested, then a different data pattern may be applied (step 530). In an example, the step of applying the data pattern (step 530) and the step of testing the termination impedances (step 540) may continue to repeat until all the terminations impedances from the numerous configurable I/O modules having I/O terminals with series terminations have been tested.

The method described above may be used to test an IC having numerous I/O terminals including programmable series terminations. The IC may include numerous DCI modules, where each DCI module may control or configure a portion of the numerous programmable I/O terminals. The DCI modules may provide signals that may program values of the series terminations of the I/O terminals. The signals provides by the DCI modules are based on a reference source coupled to each DCI module. In an example, each DCI module may be coupled to a different reference source, where the reference source may enable each DCI module to set series termination impedance values corresponding with the I/O terminals associated with the enabled DCI module. Since the test method of FIG. 5 describes testing only one configurable I/O bank at a given time, this may facilitate the coupling of the numerous I/O terminals of the IC together and to test channels of a test system. Also, in the test mode reference terminals the DCI modules may be coupled together and to a reference source. Therefore, the coupling of the numerous I/O terminals may save valuable test system resources and reduce test system requirements, for example, the test system may need much fewer tester channels. In another example, reducing test time may be possible by minimizing the number of reconfigurations of an IC, such as an FPGA, since FPGAs requires configurations prior to operation. Other benefits of the method described above may include using a test system having a limited resource, such as current sources providing the reference impedance. Such test system may be used at a reduced cost yet maintaining full testing capability.

The circuits and method describe above for testing an IC including numerous DCI modules may be used to test other types of adjustable elements. For example, the DCI modules may control/adjust other type of terminations (e.g., parallel terminations) or configurable elements (e.g., adjustable resistors). The methods described above may be applicable to test such parallel termination and/or adjustable resistors utilizing a reduced cost test equipment, while maintaining fully test capability.

Further, transistors, pass gates, multiplexers, buffers, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known. In an example, circuit 400 may employ other types of FFs to perform the same function as the D_FFs 410-412.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. An integrated circuit (IC), comprising:
a plurality of output circuits including terminations having configurable termination impedance, wherein the output circuits are configurable to implement one of a plurality of different termination impedances when active;
a plurality of digitally controlled impedance (DCI) modules coupled to the configurable terminations of the plurality of output circuits;
a plurality of select circuits having outputs coupled to enable terminals of the plurality of DCI modules,
wherein when operating the IC in a test mode, the plurality of select circuits is configured to selectively couple first control signals to the enable terminals of the plurality of DCI modules,
wherein the first control signals enable only one DCI module of the plurality of DCI modules at a time, and
wherein when operating the IC in the test mode, a reference source external to the IC is coupled to the plurality of DCI modules, wherein the reference source provides second control signals to each of the plurality of DCI modules, and wherein each DCI module selects a same termination impedance for each of the terminations responsive to the second control signals.

2. The IC of claim 1, wherein the reference source is a current source, and
wherein the current source provides current simulating reference impedance.

3. The IC of claim 1, wherein the reference source is a resistor.

4. The IC of claim 1, wherein the first control signals comprises data provided by a source external to the IC.

5. The IC of claim 1, further comprising a shift register having outputs coupled to the plurality of select circuits, and an input coupled to a test pattern signal,
wherein when operating the IC in the test mode, the outputs of the shift register are selectively coupled to the enable terminals of the plurality of DCI modules based on a test mode signal.

6. The IC of claim 5, wherein the shift register further comprises a feedback register having an input coupled to receive an output of the outputs of the shift register and an output coupled only to the input of the shift register,
wherein the output of the feedback register is the test pattern signal.

7. The IC of claim 6, wherein when operating the IC in the test mode, the feedback register is initialized based on the test mode signal.

8. A method of testing a plurality of terminals of an integrated circuit (IC) and a plurality of digitally controlled impedance (DCI) modules coupled with the plurality of terminals, the method comprising:
coupling a control module to the plurality of DCI modules;
operating the control module in a test mode;
coupling a reference source to the plurality of DCI modules, wherein the reference source is external to the IC and provides same control signals to each of the plurality of DCI modules;
applying a data pattern to input of the control module; and
testing impedances of the plurality of terminals,
wherein each DCI module of the plurality of DCI modules configures impedances of a portion of the plurality of terminals, wherein values of the impedances of the plurality of terminals when active are based on the same control signals provided by the reference source, and wherein the applied data pattern while in the test mode enables only one DCI module of the plurality of DCI modules at a time.

9. The method of claim 8, further comprising sourcing a current to generate the reference source.

10. The method of claim 8, wherein the control module comprises a shift register module selectively providing control signals coupled to the plurality of DCI modules.

11. The method of claim 8, wherein the control module is a part of a scan chain of the IC.

12. A test system including an integrated circuit (IC), comprising:
   a plurality of digitally controlled impedance (DCI) circuits of the IC coupled to receive a reference source;
   a plurality of terminals of the IC coupled to the plurality of DCI circuits;
   a control circuit coupled to the plurality of DCI circuits;
   test equipment coupled with at least a portion of the plurality of terminals of the IC; and
   a printed circuit board (PCB) for coupling the IC with the test equipment,
   wherein when operating the IC in a test mode, outputs of the control circuit selectively enable only one DCI circuit of the plurality of DCI circuits at a time, and
   wherein each DCI circuit of the plurality of DCI circuits configures impedance of a portion of terminals of the plurality of terminals responsive to same control signals generated from the test equipment, wherein the same control signals select one of a plurality of impedances for the portion of terminals when active.

13. The test system of claim 12, wherein the reference source comprises a current source.

14. The test system of claim 12, wherein the reference source comprises a resistor.

15. The test system of claim 12, wherein the control circuit comprises;
   a shift register circuit coupled to receive a test pattern signal;
   a plurality of multiplexer circuits coupled to receive outputs of the shift register circuit and provide outputs coupled to enable terminals of the plurality of DCI circuits,
   wherein outputs of the shift register circuit are selectively coupled to the enable terminals of the plurality of DCI circuits based on a test mode signal.

16. The test system of claim 15, wherein the test equipment provides the test pattern signal.

17. The test system of claim 15, wherein the control circuit further comprises a feedback register coupled to receive an output of the shift register circuit, and provide an output coupled only to an input of the shift register circuit,
   wherein the output of the feedback register is the test pattern signal.

18. The test system of claim 17, wherein the shift register circuit comprises a plurality of flip-flops, wherein the feedback register is configurable to be set or reset independently of a value shifted through each of the plurality of the flip-flops of the shift register responsive to a set signal or a reset signal, respectively.

19. The IC of claim 6, wherein the shift register comprises a plurality of flip-flops, wherein the feedback register is configurable to be set or reset independently of a value shifted through each of the plurality of the flip-flops of the shift register responsive to a set signal or a reset signal, respectively.

20. The method of claim 10, wherein the shift register comprises a plurality of flip-flops and a feedback register, the method further comprising:
   selectively setting or resetting the feedback register independently of a value shifted through each of the plurality of flip-flops of the shift register responsive to a set signal or a reset signal, respectively.

* * * * *